(12) United States Patent
Lo et al.

(10) Patent No.: US 8,110,775 B2
(45) Date of Patent: Feb. 7, 2012

(54) SYSTEMS AND METHODS FOR DISTINGUISHING REFLECTIONS OF MULTIPLE LASER BEAMS FOR CALIBRATION FOR SEMICONDUCTOR STRUCTURE PROCESSING

(75) Inventors: Ho Wai Lo, Portland, OR (US); David Martin Hemenway, Beaverton, OR (US); Brady Nilsen, Beaverton, OR (US); Kelly J. Bruland, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1516 days.

(21) Appl. No.: 11/499,394

(22) Filed: Aug. 3, 2006

(65) Prior Publication Data

US 2007/0008534 A1    Jan. 11, 2007

Related U.S. Application Data

(63) Continuation-in-part of application No. 11/051,265, filed on Feb. 4, 2005, now Pat. No. 7,435,927.

(60) Provisional application No. 60/580,917, filed on Jun. 18, 2004.

(51) Int. Cl.
*B23K 26/04* (2006.01)

(52) U.S. Cl. .............................. 219/121.68; 219/121.83

(58) Field of Classification Search ............. 219/121.62, 219/121.77, 121.78, 121.79, 121.8, 121.81, 219/121.83, 121.76, 121.68, 121.69; 356/614, 356/615, 620; 250/559.3, 548, 559.29
See application file for complete search history.

(56) References Cited

U.S. PATENT DOCUMENTS

| | | | |
|---|---|---|---|
| 4,727,381 A | | 2/1988 | Bille et al. |
| 5,357,365 A | | 10/1994 | Ipposhi et al. |
| 5,528,372 A | * | 6/1996 | Kawashima .................. 356/401 |
| 5,615,013 A | * | 3/1997 | Rueb et al. .................... 356/615 |
| 6,103,991 A | * | 8/2000 | Domae et al. ............ 219/121.83 |
| 6,180,913 B1 | * | 1/2001 | Kolmeder et al. ....... 219/121.68 |
| 7,072,566 B2 | * | 7/2006 | Seo et al. ................ 219/121.62 |
| 2002/0094008 A1 | | 7/2002 | Tanaka |
| 2004/0070804 A1 | * | 4/2004 | Knebel ......................... 359/201 |

FOREIGN PATENT DOCUMENTS

JP    2-137682 A    *    5/1990

(Continued)

OTHER PUBLICATIONS

Machine translation of Japan Patent document No. 10-58,173, Apr. 2010.*

(Continued)

*Primary Examiner* — Geoffrey S Evans
(74) *Attorney, Agent, or Firm* — Stoel Rives LLP

(57) ABSTRACT

A system determines relative positions of a semiconductor substrate and a plurality of laser beam spots on or within the semiconductor substrate in a machine for selectively irradiating structures on or within the substrate using a plurality of laser beams. The system comprises a laser source, first and second laser beam propagation paths, first and second reflection sensors, and a processor. The laser source produces at least the first and second laser beams, which propagate toward the substrate along the first and second propagation paths, respectively, which have respective first and second axes that intersects the substrate at respective first and second spots. The reflection sensors are positioned to detect reflection of the spots, as the spots moves relative to the substrate, thereby generating reflection signals. The processor is configured to determine, based on the reflection signals, positions of the spots on or within the substrate.

39 Claims, 7 Drawing Sheets

FOREIGN PATENT DOCUMENTS

| | | | | |
|---|---|---|---|---|
| JP | 3-193284 | A | * | 8/1991 |
| JP | 10-58173 | A | * | 3/1998 |
| JP | 10-89918 | A | * | 4/1998 |
| JP | 10-328873 | A | * | 12/1998 |
| JP | 11-104863 | A | * | 4/1999 |
| JP | 11-149317 | A | * | 6/1999 |
| JP | 2000-298004 | A | * | 10/2000 |
| JP | 2001-334376 | A | * | 12/2001 |

OTHER PUBLICATIONS

Machine translation of Japan Patent document No. 10-89,918, Apr. 2010.*

Machine translation of Japan Patent document No. 2000-298,004, Apr. 2010.*

Machine translation of Japan Patent Document No. 10-328,873, Nov. 2010.*

Machine translation of Japan Patent Document No. 11-104,863, Nov. 2010.*

Machine translation of Japan Patent Document No. 11-149,317, Nov. 2010.*

International Search Report and Written Opinion for PCT/US2007/074773, completed Dec. 18, 2007.

* cited by examiner

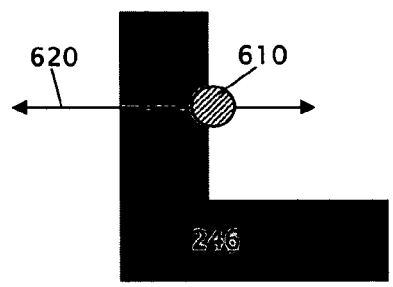 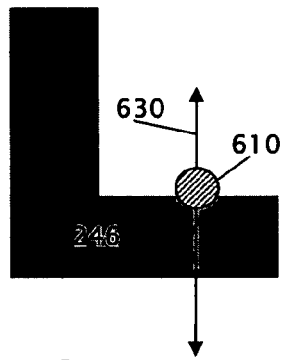
FIG. 7A     FIG. 7B
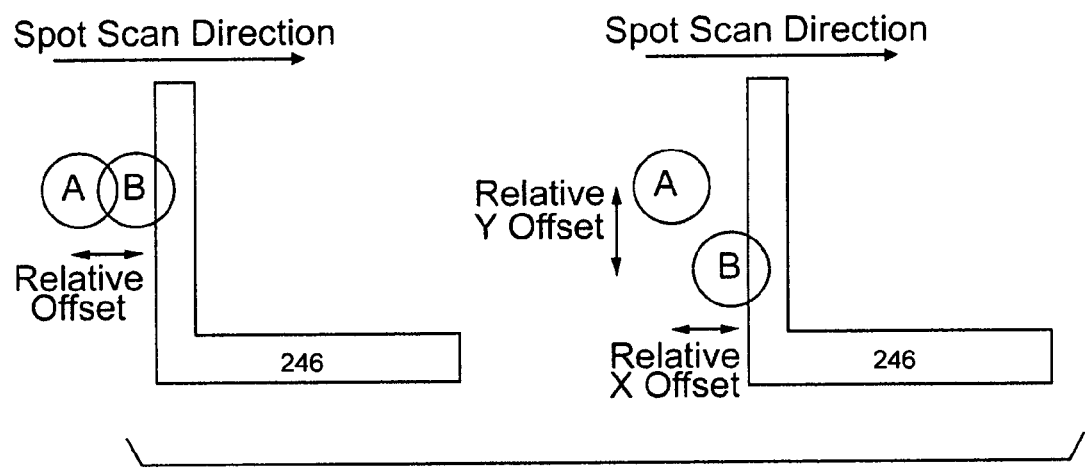
FIG. 8

SYSTEMS AND METHODS FOR DISTINGUISHING REFLECTIONS OF MULTIPLE LASER BEAMS FOR CALIBRATION FOR SEMICONDUCTOR STRUCTURE PROCESSING

RELATED APPLICATIONS

This application is a continuation-in-part of U.S. patent application Ser. No. 11/051,265, filed Feb. 4, 2005, and entitled "Semiconductor Structure Processing Using Multiple Laterally Spaced Laser Beam Spots With On-Axis Offset," which claims priority to U.S. Provisional Application No. 60/580,917, filed Jun. 18, 2004, and entitled "Multiple-Beam Semiconductor Link Processing." Both of the preceding applications are incorporated by reference herein.

The following other U.S. patent applications tiled Feb. 4, 2005, are also incorporated by reference herein:

application Ser. No. 11/051,262, now U.S. Pat. No. 7,435,927, entitled "Semiconductor Structure Processing Using Multiple Laterally Spaced Laser Beam Spots Delivering Multiple Blows";

application Ser. No. 11/052,014, now U.S. Pat. No. 7,629,234, entitled "Semiconductor Structure Processing Using Multiple Laterally Spaced Laser Beam Spots with Joint Velocity Profiling";

application Ser. No. 11/051,500, entitled "Semiconductor Structure Processing Using Multiple Laser Beam Spots Spaced On-Axis Delivered Simultaneously";

application Ser. No. 11/052,000, now U.S. Pat. No. 7,923,206, entitled "Semiconductor Structure Processing Using Multiple Laser Beam Spots";

application Ser. No. 11/051,263, now U.S. Pat. No. 7,935,941, entitled "Semiconductor Structure Processing Using Multiple Laser Beam Spots Spaced On-Axis on Non-Adjacent Structures";

application Ser. No. 11/051,958, entitled now U.S. Pat. No. 7,425,471, "Semiconductor Structure Processing Using Multiple Laser Beam Spots Spaced On-Axis with Cross-Axis Offset"; and application Ser. No. 11/051,261, now U.S. Pat. No. 7,633,034, entitled "Semiconductor Structure Processing Using Multiple Laterally Spaced Laser Beam Spots Overlapping Lengthwise on a Structure."

application Ser. No. 11/051,958, entitled "Semiconductor Structure Processing Using Multiple Laser Beam Spots Spaced On-Axis with Cross-Axis Offset"; and application Ser. No. 11/051,261, entitled "Semiconductor Structure Processing Using Multiple Laser Beam Spots Overlapping Lengthwise on a Structure".

TECHNICAL FIELD

This disclosure relates generally to manufacturing semiconductor integrated circuits and more particularly to the use of laser beams to process structures on or within a semiconductor integrated circuit.

BACKGROUND INFORMATION

During their fabrication process, ICs (integrated circuits) often incur defects for various reasons. For that reason, IC devices are usually designed to contain redundant circuit elements, such as spare rows and columns of memory cells in semiconductor memory devices, e.g., a DRAM (dynamic random access memory), an SRAM (static random access memory), or an embedded memory. Such devices are also designed to include particular laser-severable links between electrical contacts of the redundant circuit elements. Such links can be removed, for example, to disconnect a defective memory cell and to substitute a replacement redundant cell. Similar techniques are also used to sever links in order to program or configure logic products, such as gate arrays or ASICs (application-specific integrated circuits). After an IC has been fabricated, its circuit elements are tested for defects, and the locations of defects may be recorded in a database. Combined with positional information regarding the layout of the IC and the location of its circuit elements, a laser-based link processing system can be employed to remove selected links so as to make the IC useful.

Laser-severable links are typically about 0.5-1 microns ($\mu m$) thick, about 0.5-1 $\mu m$ wide, and about 8 $\mu m$ in length. Circuit element in an IC, and thus links between those elements, are typically arranged in a regular geometric arrangement, such as in regular rows. In a typical row of links, the center-to-center pitch between adjacent links is about 2-3 $\mu m$. These dimensions are representative, and are declining as technological advances allow for the fabrication of workpieces with smaller features and the creation of laser processing systems with greater accuracy and smaller focused laser beam spots. Although the most prevalent link materials have been polysilicon and like compositions, memory manufacturers have more recently adopted a variety of more conductive metallic link materials that may include, but are not limited to, aluminum, copper, gold, nickel, titanium, tungsten, platinum, as well as other metals, metal alloys, metal nitrides such as titanium or tantalum nitride, metal silicides such as tungsten silicide, or other metal-like materials.

Conventional laser-based semiconductor link processing systems focus a single pulse of laser output having a pulse width of about 4 to 30 nanoseconds (ns) at each link. The laser beam is incident upon the IC with a footprint or spot size large enough to remove one and only one link at a time. When a laser pulse impinges a polysilicon or metal link positioned above a silicon substrate and between component layers of a passivation layer stack including an overlying passivation layer, which is typically 2000-10,000 angstrom (Å) thick, and an underlying passivation layer, the silicon substrate absorbs a relatively small proportional quantity of infrared (IR) radiation and the passivation layers (silicon dioxide or silicon nitride) are relatively transparent to IR radiation. Infrared (IR) and visible laser wavelengths (e.g., 0.522 $\mu m$, 1.047 $\mu m$, 1.064 $\mu m$, 1.321 $\mu m$, and 1.34 $\mu m$) have been employed for more than 20 years to remove circuit links.

Laser processing systems have traditionally employed a single laser pulse focused into a small spot for link removal. Banks of links to be removed are typically arranged on the wafer in a straight row, an illustrative one of which is shown in FIG. 1. The row need not be perfectly straight, although typically it is quite straight. The links are processed by the system in a link run 120, which is also referred to as an on-the-fly ("OTF") run or processing run. During the link run 120, the laser beam is pulsed as a stage positioner continuously passes the row of links across a focused laser spot location 110. The stage typically moves along a single axis at a time and does not stop at each link position. Thus the link run 120 is a processing pass down a row of links in a generally lengthwise direction (horizontally across the page as shown.) Moreover, the lengthwise direction of the link run 120 need not be exactly straight or perpendicular to the lengthwise direction of the individual links that constitute the row, although that is typically approximately true. Impingent upon selected links in the link run 120 is a laser beam whose propagation path is along an axis. The position at which that axis intersects the workpiece continually advances along the link run 120 while pulsing the laser to selectively remove links. The laser is triggered to emit a pulse and sever a link when the wafer and optical components have a relative position such that the pulse energy will impinge upon the link (e.g., when the laser spot 110 matches a trigger position 130). Some of the links are not irradiated and left as unprocessed links 140, while others are irradiated to become severed links 150.

FIG. 2 illustrates a typical link processing system that adjusts the spot position by moving a wafer 240 in an XY plane underneath a stationary optics table 210. The optics table 210 supports a laser 220, a final turn mirror 225, a focusing lens 230, and possibly other optical hardware. The wafer 240 is moved underneath in the XY plane by placing it on a chuck 250 that is carried by a motion stage 260. Alternatively, the wafer 240 can be held still while the optical equipment on the optics table 210 move. As yet another alternative, both the wafer 240 and the optical equipment on the optics table 210 may move to impart a desired relative motion.

FIG. 3A depicts a top view representation of the wafer 240, which includes a number of dies 242. The dies 242 are generally laid out in a regular geometric arrangement. A group of contiguous dies in a typically rectangular pattern constitutes an alignment region 244, at or near the corners of which may be dedicated alignment targets 246. There may be additional alignment targets (not shown) on or near each die. The alignment targets 246 can be used to align the laser beam spot 110 to the wafer 240. Alignment data gathered from the alignment targets 246 in each corner of an alignment region 244 can be used to calculate the positions of links to be processed within each die in the alignment region 244. For example, surface fitting algorithms can be applied to the known corner alignment target data to fit a surface model to the alignment region. This process is sometimes referred to as position geometry correction (PGC).

FIG. 3B is an illustration of link runs across a semiconductor die 242. Both X direction link runs (along the X direction trajectories 310) and Y direction link runs (along the Y direction trajectories 320) are shown. A conventional sequential link blowing process requires scanning the XY motion stage 260 across the wafer 240 once for each link run. Repeatedly scanning back and forth across the wafer 240 results in complete wafer processing. A machine typically scans back and forth processing numerous X-axis link runs 310 before processing a batch of Y-axis link runs 320 (or vice versa). This example is merely illustrative. Other configurations of link runs and processing modalities are possible. For example, link banks and link runs may not be straight rows and may not be processed with continuous motion.

A laser-based link processing system can be employed to remove selected links so as to make the IC useful, as described above, provided positional information regarding the layout of the IC and the location of its circuit elements are known with sufficient accuracy. Because the layout of ideally identical IC wafers can differ slightly from wafer to wafer, it is typically necessary to determine the position of the system's laser beam spot on each wafer by detecting the spot's reflection off identifiable features on the wafer and thereby calibrating the laser system's coordinate space to those features before processing can begin. Such positional calibration processes have historically been practiced in single-beam laser-based link processing systems.

SUMMARY OF THE DISCLOSURE

According to one embodiment, a system determines relative position of a semiconductor substrate and a plurality of laser beam spots on or within the semiconductor substrate in a machine for selectively irradiating structures on or within the semiconductor substrate using a plurality of laser beams. The system comprises a laser source, a first laser beam propagation path, a second laser beam propagation path, a first reflection sensor, a second reflection sensor, and a processor. The laser source produces at least a first laser beam and a second laser beam. The first laser beam propagates along the first laser beam propagation path toward the semiconductor substrate. The first laser beam propagation path has a first laser beam axis that intersects the semiconductor substrate at a first spot. The second laser beam propagates along the second laser beam propagation path toward the semiconductor substrate. The second laser beam propagation path has a second laser beam axis that intersects the semiconductor substrate at a second spot. The first reflection sensor is positioned to detect reflection of the first spot from one or more first reflective structures on or within the semiconductor substrate as the first laser beam spot moves relative to the semiconductor substrate, thereby generating a first reflection signal. The second reflection sensor is positioned to detect reflection of the second spot from one or more second reflective structures on or within the semiconductor substrate as the second laser beam spot moves relative to the semiconductor substrate, thereby generating a second reflection signal. The processor is configured to determine, based on the first and second reflection signals, positions of the first and second spots on or within the semiconductor substrate.

According to another embodiment, a system determines relative position between a semiconductor substrate and at least one of a plurality of laser beam spots on or within the semiconductor substrate in a machine for selectively irradiating structures on or within the semiconductor substrate using a plurality of laser beams. The system comprises a laser source, a first laser beam propagation path, a second laser beam propagation path, a reflection sensor, and a processor. The laser source produces at least a first laser beam and a second laser beam. The first laser beam propagates toward the semiconductor substrate along the first laser beam propagation path, which has a first laser beam axis that intersects the semiconductor substrate at a first spot. The second laser beam propagates toward the semiconductor substrate along the second laser beam propagation path, which has a second laser beam axis that intersects the semiconductor substrate at a second spot. The reflection sensor is positioned to detect reflection of one or both of the first and second spots from one or more reflective structures on or within the semiconductor substrate as one or both of the first and second laser beam spots move relative to the semiconductor substrate, thereby generating at least one reflection signal. The processor is configured to determine, based on said at least one reflection signal, positions of one or both of the first and second spots on or within the semiconductor substrate.

According to yet another embodiment, a method determines relative position of a semiconductor substrate and at least one laser beam spot on or within the semiconductor substrate in a machine used to selectively irradiate structures on or within the semiconductor substrate using a plurality of laser beams. The method produces at least a first laser beam and a second laser beam. The first laser beam propagates toward the semiconductor substrate along a first laser beam propagation path having a first laser beam axis that intersects the semiconductor substrate at a first spot. The second laser beam propagates toward the semiconductor substrate along a second laser beam propagation path having a second laser beam axis that intersects the semiconductor substrate at a second spot. The method detects reflection of at least one of the first and second spots from one or more reflective structures on or within the semiconductor substrate as the first laser beam spot moves relative to the semiconductor substrate, thereby generating at least one reflection signal. The method then determines, based on said at least one reflection signal, positions of at least one of the first and second spots on or within the semiconductor substrate.

As used herein: the term "on," as it pertains to the physical relationship of two or more items, means not just directly on but atop, above, over, or covering, in any way, partially or fully; the term "substantially" is a broadening term that means about or approximately but does not imply a high degree of closeness.

Additional details concerning the construction and operation of particular embodiments are set forth in the following sections with reference to the below-listed drawings.

BRIEF DESCRIPTION OF THE DRAWINGS

FIG. 7A is a plan view of an alignment target showing a laser beam spot, used to measure X position of the beam spot.

FIG. 7B is a plan view of an alignment target showing a laser beam spot, used to measure Y position of the beam spot.

FIG. 8 is a plan view of an alignment target showing two laser beam spots, used to measure XY positions and/or relative offset.

DETAILED DESCRIPTION OF EMBODIMENTS

With reference to the above-listed drawings, this section describes particular embodiments and their detailed construction and operation. The embodiments described herein are set forth by way of illustration only. Those skilled in the art will recognize in light of the teachings herein that variations can be made to the embodiments described herein and that other embodiments are possible. No attempt is made to exhaustively catalog all possible embodiments and all possible variations of the described embodiments. For the sake of clarity and conciseness, certain aspects of components or steps of certain embodiments are presented without undue detail where such detail would be apparent to those skilled in the art in light of the teachings herein and/or where such detail would obfuscate an understanding of more pertinent aspects of the embodiments.

Generally speaking, the embodiments described herein enable positional calibration processes to be performed in multi-beam systems. In order to do so, a multi-beam system distinguishes among the reflections of its various laser beams off the wafer or other workpiece. Techniques for achieving this reflection signal separation include utilizing different optical properties in each beam, temporally separating the spots from each other such that only one spot is on at a time, spatially separating the spots from each other as they scan across the workpiece with a priori knowledge of the ordering of the spots, and encoding the incident laser beams such that their reflection signals can be separated by appropriate decoding. Multiple reflection detectors or a single reflection detector may be utilized.

As one skilled in the art will appreciate in light of this disclosure, certain embodiments are capable of achieving certain advantages over the known prior art, including some or all of the following: (1) enabling positional calibration of multiple laser beams; (2) thereby realizing the advantages of multi-beam processing, including its throughput advantages; (3) enhancing positional calibration accuracy or reliability in multi-beam systems; and (4) improved immunity to long-term drift, as such drift can be better characterized and calibrated away using techniques described herein. These and other advantages of various embodiments will be apparent upon reading the remainder of this section.

Multiple-spot processing may take many different forms, with laser pulses being delivered to links with a different lateral (cross-axis) spacing, different on-axis spacing, different on-axis and cross-axis spacing, or no difference in link spacing. Each of these different configurations offers different throughput and processing advantages and are explained in greater detail next, with reference to FIG. 4.

Figure 1:
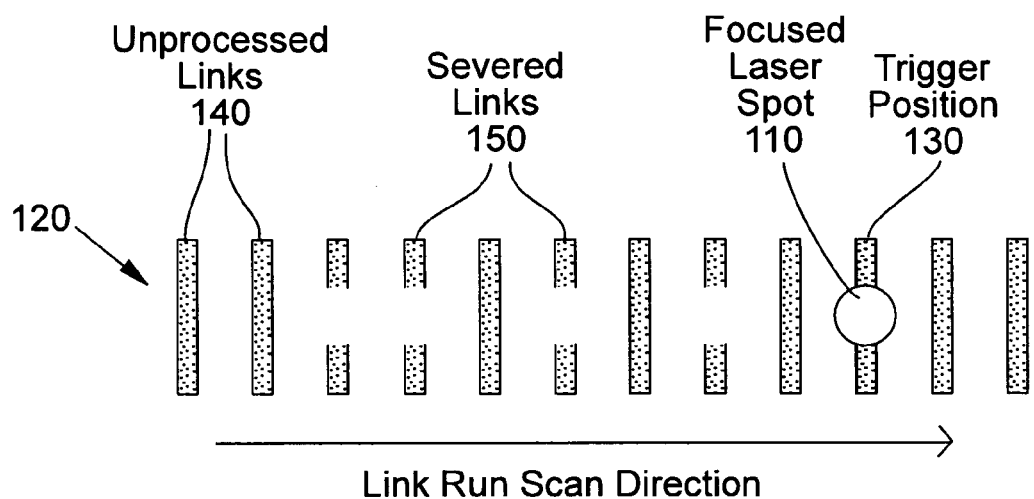
FIG. 1 is a diagram of a row or bank of links being selectively irradiated with a laser spot scanning along the lengthwise direction of the bank.
Figure 2:
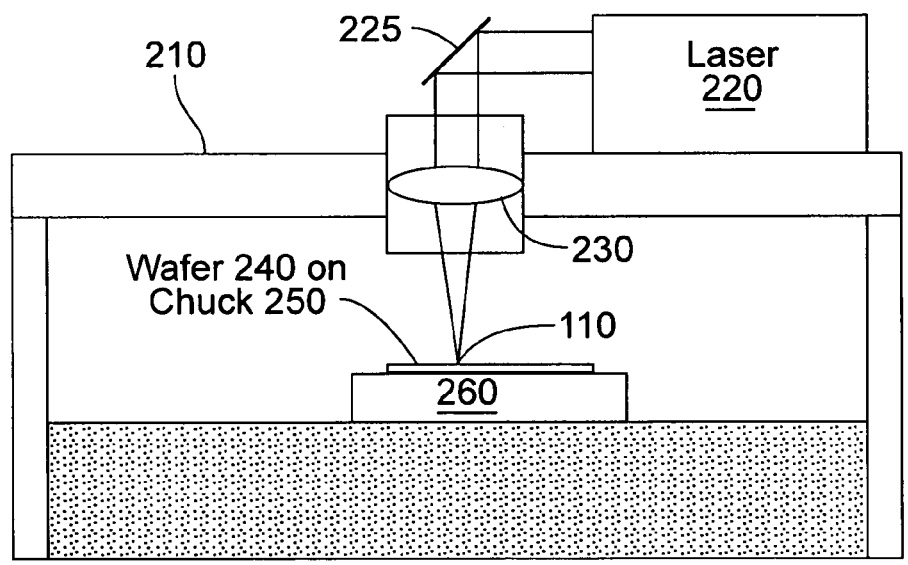
FIG. 2 is a diagram of a link processing system.
Figure 3A:
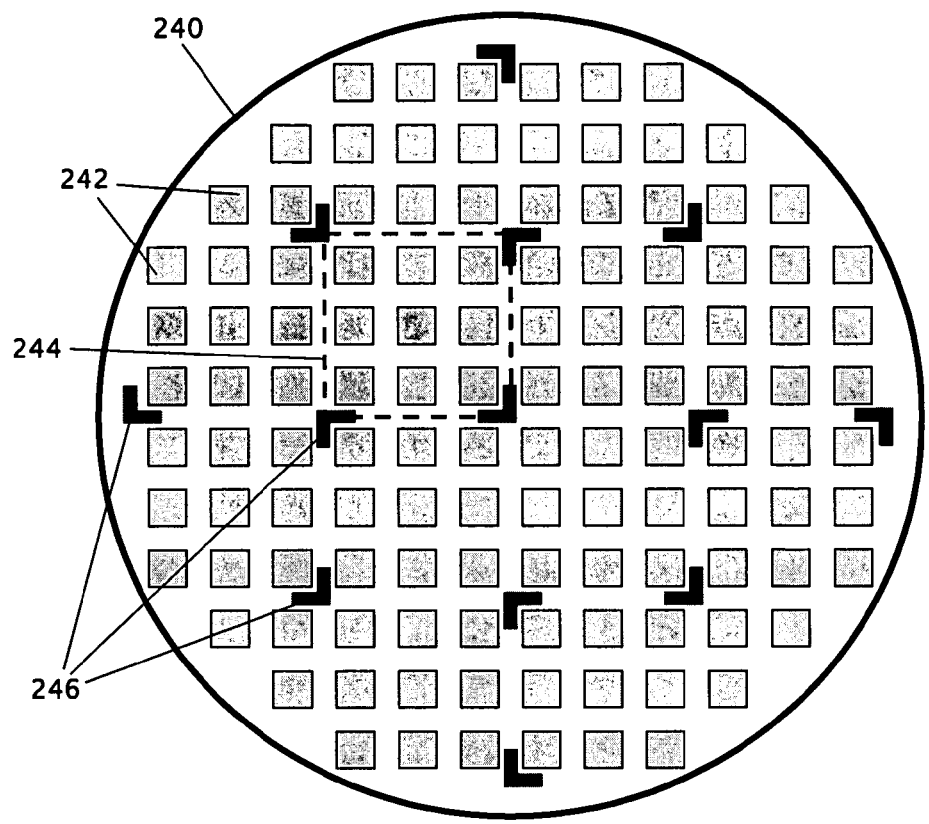
FIG. 3A is an illustration of a semiconductor wafer.
Figure 3B:
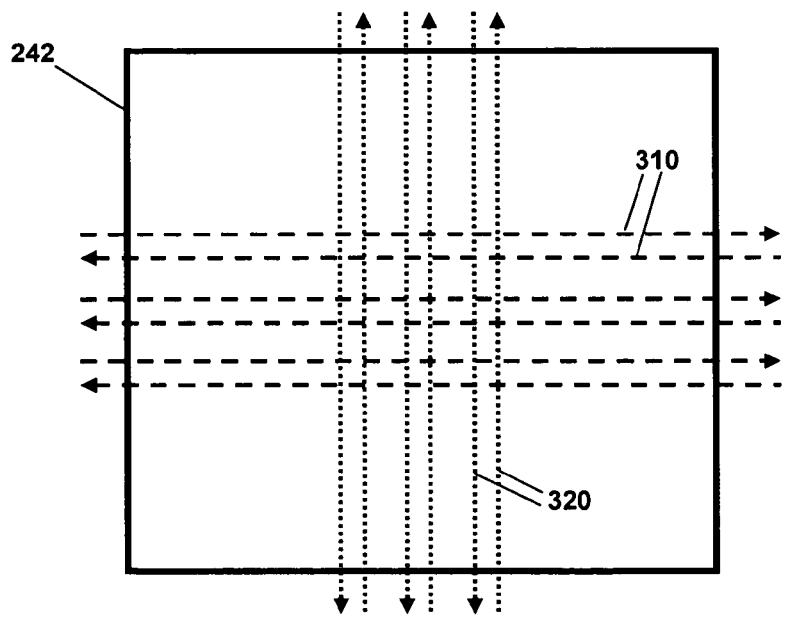
FIG. 3B is an illustration of link runs on a die on the semiconductor wafer of FIG. 3A.
Figure 4:
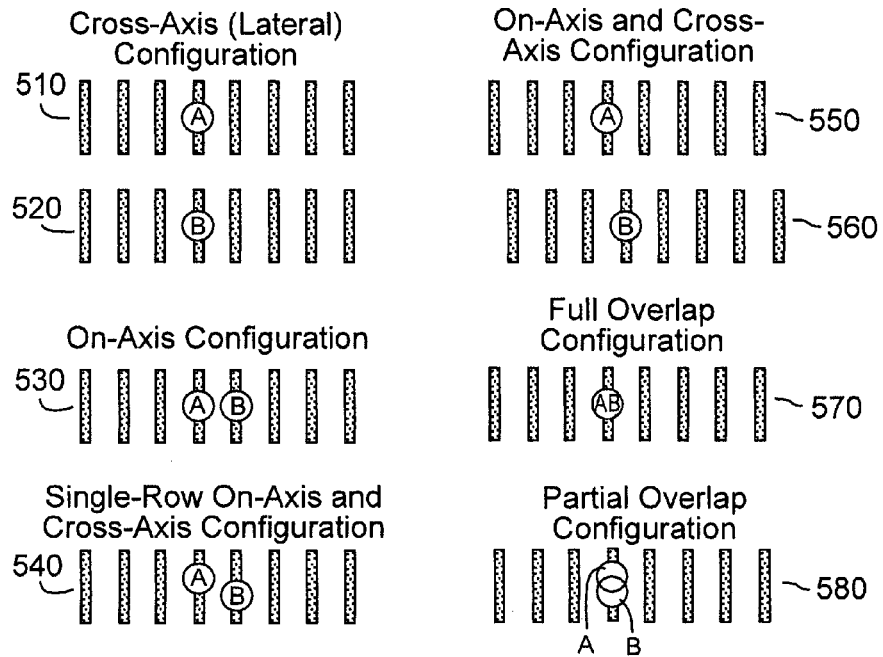
FIG. 4 is an illustration of various two-spot arrangements according to various embodiments.

FIG. 4 depicts links being processed with some of the possible spacings of two laser spots. The two laser spots are denoted "A" and "B" in the figure. In the laterally (or cross-axis) spaced arrangement, spot A is on a link in one bank 510, while spot B is offset on a corresponding link in a different, typically parallel, bank 520. Because spots A and B preferably advance in unison horizontally across the link runs 510 and 520, as depicted in FIG. 4, the two spots can be said to be displaced relative to one another in the cross-axis direction, with respect to the direction of spot motion. Although we say that spots A and B advance along their respective link banks, that is a linguistic shorthand. More precisely, one may say a spot results from a laser beam when the laser beam is on. In the case of an intermittent laser beam, such as a pulsed laser beam, the resulting spot on the IC workpiece comes and goes as the laser beam turns on and off. However, the laser beam propagates along a propagation path that has an axis, and that path and axis always exist whether the beam is on or not. Thus, to be precise, a laser beam path or axis moves along the link run, and when we refer to a "spot" herein we typically mean the point or area where a laser beam's axis or path intersects the workpiece, whether the laser is on (i.e., energized) or off. At any given time during a link run, the axis intersects the IC workpiece either on a link or between two adjacent links. When a laser beam axis intersects a link that has been selected for removal, the laser beam is energized to sever the link. When the laser axis is moving along a bank of regular spaced links (with the approximately uniform pitch), the laser beam can be pulsed by various techniques, such as based on measured position information or based on timing, such as at a rate equivalent to and synchronized in phase with the spot's crossing of links. The laser pulses can be selectively passed or blocked to sever a given link or leave it intact.

While the spots A and B are illustrated as having a circular shape in FIG. 4 and others, they may have any arbitrary shape that a laser beam can produce.

As already mentioned, an advantage of laterally spaced spots is that wafer processing can be accomplished with fewer link runs, resulting in greater throughput without any laser or motion stage enhancements. Thus, from the perspective of increasing throughput, this is a valuable form of parallelism. However, parallelism can take a variety of forms, which can offer various advantages.

In an on-axis arrangement, spots A and B are on different links in the same link bank 530 and may be substantially aligned along the axis of spot motion. Although spots A and B are directed on adjacent links in the FIG. 4 illustration, that need not be the case; for example, spot A may lead spot B by two or more links, or vice versa. Advantages of on-axis spaced laser spots include the following: (1) link run velocity can be increased to enhance throughput, because the spots can advance twice as far between pulses; (2) multiple laser pulses can be delivered to a link during on-the-fly processing without repeating a link run; and (3) laser pulses with different properties can be selectively applied to a link.

Hybrids of both cross-axis and on-axis spacing are also possible, as shown in two illustrative examples in FIG. 4. In one arrangement, spots A and B may be offset along the lateral axis while remaining on the same row or bank 540 of links. Advantages of that single-row on-axis and cross-axis hybrid arrangement include better dissipation of energy in the area between the two spots, as they are separated by a somewhat greater distance than in the case without any cross-axis offset. In another arrangement, spots A and B fall on different banks 550 and 560 and are offset in the on-axis direction as well. As IC feature sizes continue to shrink, an on-axis offset between laterally spaced spots on adjacent rows can also result in better laser energy dissipation in the vicinity of the two spots, especially when pulsed simultaneously. Note that processing in the on-axis and cross-axis configuration is possible with nearby link banks that are staggered, as shown in the on-axis and cross-axis configuration of FIG. 4, or regularly arranged as in the layout of the cross-axis (lateral) configuration case.

Furthermore, in an overlap configuration, as shown twice in FIG. 4, spots A and B can be partially or substantially fully overlapping on the same link in the same link bank 570 (full overlap) or 580 (partial overlap). Advantages of multiple overlapped laser spots are that (1) laser spots with different optical properties can be selectively delivered to a link and (2) combining laser pulses that arrive at slightly different times is a method for temporally shaping the effective combined pulse profile.

For multi-spot processing, the triggering of lasers to generate a pulse may be based purely upon timing signals, or may be based upon actual, measured, estimated, or commanded positions of a spot, the workpiece, or the workpiece relative to the spot. Pulse generation may also be triggered based upon average positions or estimated positions of multiple spots relative to multiple targets. Processing is preferably based on position data, as that approach provides very accurate placement of laser pulses. U.S. Pat. No. 6,172,325, assigned to the assignee of the present invention and incorporated in its entirety herein by reference, describes laser-pulse-on-position technology. Triggering may also be based on a combination of position and timing data.

Figure 5A:
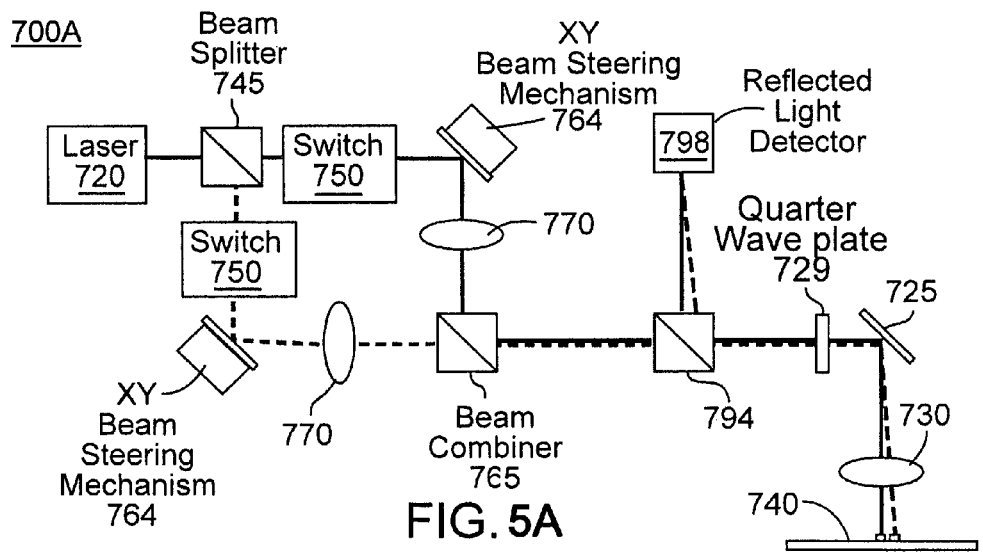
FIG. 5A is a block diagram of a two-spot laser processing system with position calibration capability, according to one embodiment.

FIG. 5A is a block diagram of a dual-beam link processing system 700A with a position calibration capability, according to one embodiment. The system 700A comprises a laser 720 and a beam splitter 745, which splits the laser beam from the laser 720 into two beams. Alternatively, two lasers could be used in place of the laser 720 and the beam splitter 745. In general a N-beam laser source may comprise N lasers or fewer lasers and one or more beam splitters. Returning to FIG. 5A, each beam from the beam splitter 745 passes through an optical switch 750, which may be any type of optical shutter, such as an acousto-optic modulator (AOM) or the like. The optical switches 750 can be actuated to selectively pass or block its laser beam. From the optical switch 750 each beam reflects off a steerable mirror 764 and through a lens 770, which may be a relay lens, before entering a beam combiner 765, from which both beams propagate together into a beam splitter 794. In the direction from the beam combiner 765 toward the wafer 740, the beam combiner 794 passes the beams through a quarter-wave plate 729, a final turn mirror 725, and a focusing lens 730 onto the wafer 740. Other embodiments are possible.

In a calibration scanning mode, the system 700A directs one or more alignment or calibration beams onto the wafer 740. These alignment or calibration beams may differ from the laser beams used for processing the wafer 740 by having less energy or by being continuous-wave beams rather than pulsed laser beams. Reflections off the wafer 740 propagate back through the focusing lens 730, off the final turn mirror 725, through the quarter-wave plate 729 and into the beam splitter 794. The beam splitter 794 diverts these reflected signals toward a reflected light detector 798, which is arranged to detect the presence or energy in the reflected signals. In a typical alignment scan (sometimes referred to as beam-to-work or beam-to-workpiece (BTW) scans), one or more laser beam spots are scanned across an alignment feature on the wafer 740 and reflections off the wafer 740 are detected by the reflected light detector 798 and processed to deduce positional information.

To distinguish between the two laser beams' reflections, the system 700A may be operated such that only one beam is energized at a given location at any time. This may be achieved by temporally separating the spots or spatially separating the spots as they move across the wafer 740. Alternatively or additionally, utilizing different beams with different optical properties (e.g., wavelength or polarization) can enable their reflections to be distinguished. As yet another alternative, coding or modulation can be applied to the laser beams so that they can be separated by decoding or demodulation. Reflection separation based on optical properties or coding/modulation can distinguish simultaneous reflections from the same spot, in addition to reflections that are temporally and/or spatially offset. Combinations of two or more of any of the foregoing separation techniques are also possible.

One way of doing temporal separation is to perform only one scan at a time. An advantage of that technique is that there is little or no crosstalk between the different reflections, thus providing good signal integrity. A disadvantage of that technique is that it is slower to do one scan per beam instead of scanning all beams at once. A second way to use temporal signal separation is to perform the scans of both beams simultaneously and use time slicing to ensure that only one beam is reaching the workpiece at any time. By properly correlating the measured optical reflections with the beam that was on at that instant, one can obtain the reflectivity as a function of position for each individual beam. This can be performed with either continuous-wave or pulsed laser beams using the switches 750 to pass one beam while blocking the other. An advantage of fine time slicing is that all beams can be scanned at once without appreciable crosstalk since only one beam illuminating and reflecting at one time, provided the timing control is sufficiently precise.

Signal separation may occur by spatially separating the spots on different places on the wafer 740. Disadvantages of spatial separation are that longer scans are required to get both beams across the target, some prior knowledge of which beam is the leading beam is required, and there may be some crosstalk depending upon the relative reflectivity characteristics of the wafer 740 where the spots fall.

[0046] Code-based signal separation involves encoding one or both of the laser beams with a modulation code that can be separated by appropriate decoding at or after the reflection detector 798. The coding may be imparted by on-off control of one or both of the switches 750, and the decoding may be accomplished by performing the same operation on the signal detected by the reflection detector 798. This is analogous to direct-sequence spread-spectrum techniques. Orthogonal codes, such as Walsh-Hadamard sequences, are preferred, but non-orthogonal codes, such as pseudo-noise (PN) codes, m-sequences, Gold codes, and the like may be acceptable where some cross-talk can be tolerated. The decoding operation should be synchronized with the coding and preferably takes into account the propagation and processing delays therebetween. Because the coding and decoding processes can take place in the same machine, tight timing control is possible. To maintain orthogonality, it may be preferable to keep the energy in each beam approximately equal. The rate at which transitions in the modulation code may occur (i.e., the "chip" or "spreading" rate in spread-spectrum parlance) is preferably chosen to be rapid enough to satisfy requirements for spatial resolution for a given spot scan speed.

Figure 5B:
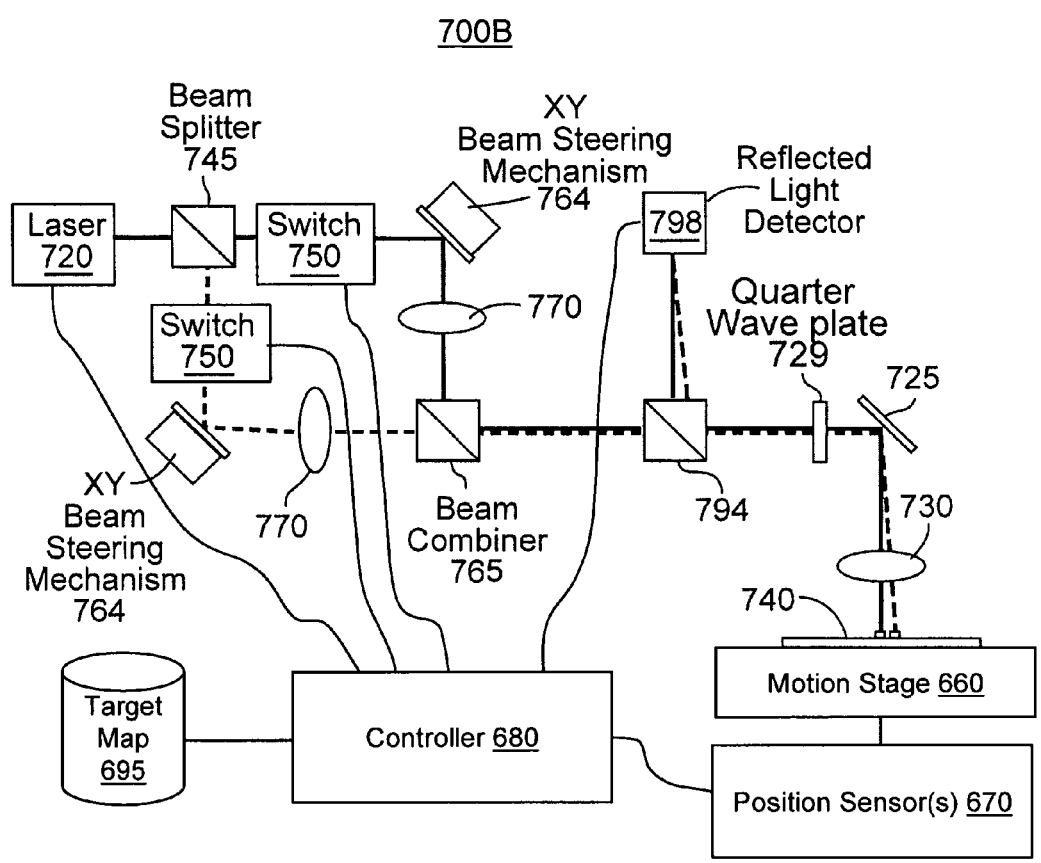
FIG. 5B is another block diagram of the two-spot laser processing system of FIG. 5A.

FIG. 5B is a block diagram of a dual-beam link processing system 700B with a position calibration capability, showing some additional components compared to FIG. 5A. In particular, FIG. 5B illustrates a motion stage 660, which can move the wafer 740 in the XY plane of the wafer 740. The motion stage 660 may be characterized by X-Y translation tables in which the wafer 740 is secured to an upper stage that moves along a first axis and is supported by a lower stage that moves along a second axis perpendicular to the first axis. Such systems typically move the workpiece 740 relative to a fixed beam position of the laser beam spots and may be referred to as stacked stage positioning systems because the lower stage supports the inertial mass of the upper stage which supports the workpiece 740. Such positioning systems can have desirable positioning accuracy because interferometers can be used along each axis to determine the absolute position of each stage. This level of accuracy is preferred for link processing because the size of the laser beam spot is typically only a little bigger than a link's width, so even a small discrepancy between the position of the laser beam spots and the target links can result in incomplete link severing. In addition, the high density of features on semiconductor wafers results in small positioning errors potentially causing laser damage to nearby structures. Alternatively, in so-called split-axis positioning systems, the upper stage is not supported by, and moves independently from, the lower stage and the workpiece 740 is carried on a first axis or stage while optical elements, such as the mirror 725 and the focusing lens 730, are carried on the second axis or stage. Split-axis positioning systems are becoming advantageous as the overall size and weight of workpieces increase, utilizing longer and hence more massive stages. As yet another alternative, the motion stage 660 may be a planar positioning system, in which the workpiece 740 is carried on a single stage that is movable by two or more actuators while the optics and laser beam spots remain in a substantially fixed position—or vice versa. Such systems translate the workpiece 740 in two dimensions by coordinating the efforts of the actuators. Some planar positioning systems may also be capable of rotating the workpiece, although that may not be necessary or desirable. Other alternative motion schemes position the laser beam spots relative to the workpiece 740 by moving the laser beam spot in one or more directions with actuated optics such as galvanometers or moving lenses and/or by moving the workpiece 130 in one or more directions. Regardless of its form, the motion stage 660 typically moves along a single axis, such as a row of links, at a time in a substantially straight path during processing.

A position sensor 670 (which may be one or more interferometers, encoders, or other means for sensing position) senses the location of the motion stage 660 and reports that position data to a controller 680. The controller 680 uses calibration data to determine where the workpiece 740 is relative to the laser beam spots. The controller 680 also accesses a target map 695, which contains data indicating target positions on the workpiece 740 that should be irradiated (e.g., to sever a link at that position). The target map 695 is typically generated, for example, from a testing process that determines which circuit elements in the workpiece 740 are defective, logic that determines which links to process to disconnect defective elements and swap in redundant elements, and CAD (computer-aided design) data or other data indicating the nominal or expected positions of the links to be processed. The controller 680 typically choreographs the pulsing of the laser 720, the shuttering of the switches 750, and the moving of the motion stage 660 so that the laser beam spots traverse over each target and emit laser pulses that reaches the workpiece 740 at the desired targets. This approach is explained in greater detail in the above-referenced U.S. Pat. No. 6,172,325.

The controller 680 may be any form of controller or processor and is preferably a digital processor, such as a general-purpose microprocessor or a digital signal processor (DSP), for example. The controller 680 may be readily programmable by software; hard-wired, such as an application specific integrated circuit (ASIC); or programmable under special circumstances, such as a programmable logic array (PLA) or field programmable gate array (FPGA), for example. Program memory for the controller 680 may be integrated within the controller 680, or may be an external memory (not shown), or both. The controller 680 executes one or more programs or modules to perform various functions. The controller 680 may contain or execute other programs or modules (not shown), such as to control the motion stage 660, to control firing of the laser 720, and to control the state of the switches 750, to transfer data, to associate data from the various components together (preferably in a suitable data structure), to perform calculations using the data, to otherwise manipulate the data, and to present results to a user or another processor.

In a typical X or Y alignment or calibration BTW scan, one or more laser beam spots are scanned across an alignment feature on the wafer 740. The reflection off the wafer 740 is sensed by the reflected energy sensor 798, which conveys its readings to the controller 680. The reflected energy readings correspond to numerous position coordinates from the position sensor 670 or from position commands sent to the motion stage 660. Differences in the received reflected power when the laser spot falls upon the alignment feature, and the area surrounding the alignment feature, are interpreted by the controller 680, along with the position coordinates, to deduce the location of the alignment feature relative to the laser beam spot 110 in the coordinate system of the motion stage 260, or vice versa. BTW scans may also be performed to determine Z focus height by scanning a feature repeatedly at different heights and detecting which height gives the narrowest reflection signal profile or the sharpest edge transitions in the reflection signal. BTW scans can also be performed to measure the slope of a beam incident on the wafer 740 by repeatedly scanning over a target at different focus heights and detecting any resulting lateral translation of the reflection. BTW scans may also be performed for the purpose of occasional static alignments to one or more laser beam paths.

Figure 6A:
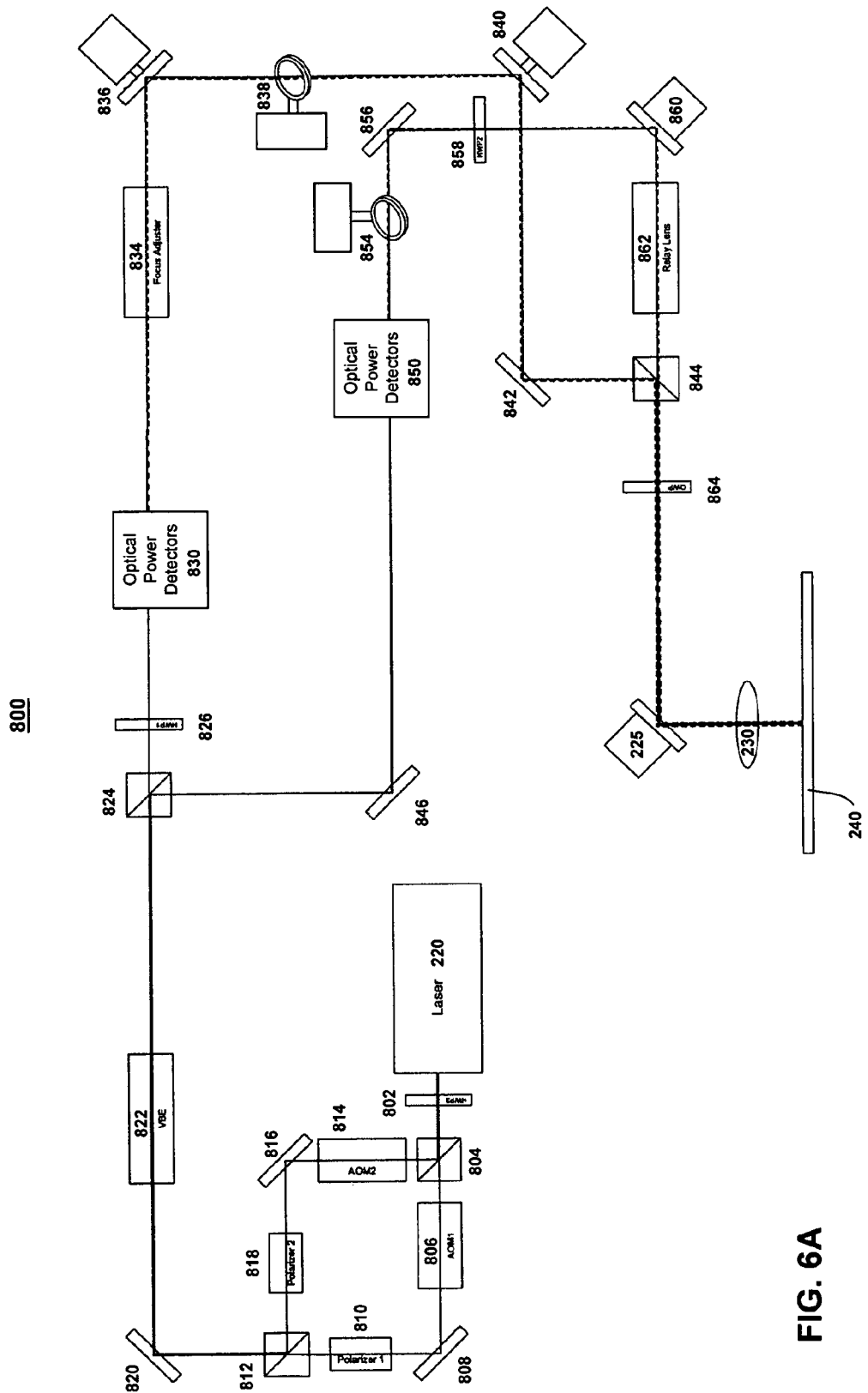
FIG. 6A is a block diagram of a dual-beam link processing optics system with a beam alignment capability according to one embodiment.

FIG. 6A is a block diagram of a dual-beam link processing optics system 800 with a position calibration capability according to another embodiment. The system 800 utilizes two reflection sensors and optical differences between the two laser beams to distinguish between beams' reflections from one another. The system 800 comprises the laser 220, which generates a laser beam directed through a half-wave plate 802 and into a polarizing beam splitter 804. From one output of the beam splitter 804 a laser beam passes through an AOM 806, a mirror 808, and a polarizer 810 into a polarizing beam combiner 812. From the other output of the beam splitter 804 a laser beam passes through or off an AOM 814, a mirror 816, and a polarizer 818 into the beam combiner 812. From the beam combiner 812, the combined laser beams reflect off a mirror 820, then into a variable beam expander ("VBE") 822 and a polarizing beam splitter 824. A first beam from the beam splitter 824 passes through a half-wave plate 826, an optical power detector 830, a focus adjuster 834, a first turnable mirror 836, a first adjustable tilt plate 838, a second turnable mirror 840, a mirror 842, and into a beam combiner 844. A second beam from the beam splitter 824 hits a mirror 846 and then passes through an optical power detector 850, a second adjustable tilt plate 854, onto a mirror 856, through a half-wave plate 858, into a third turnable mirror 860, through a relay lens 862, and into the beam combiner 844. Out of the beam combiner 844, the combined beams pass through a quarter-wave plate 864, off of the final mirror 225, through the final focus lens 230, and onto the wafer 240.

The system 800 is a split-recombine-split-recombine architecture. A first beam path passes off or though the components 220, 802, 804, 806, 808, 810, 812, 820, 822, 824, 826, 830, 834, 836, 838, 840, 842, 844, 864, 225, 230, and 240. A second beam path passes through or off the components 220, 802, 804, 814, 816, 818, 812, 820, 822, 824, 846, 850, 854, 856, 858, 860, 862, 844, 864, 225, 230, and 240. The system 800 utilizes a single laser 220, but an alternative embodiment could utilize two lasers.

Other embodiments are possible. For example, the same multi-beam calibration techniques useful in the system 800 can be utilized in a split-recombine architecture. As another example, a multi-beam system may utilize the same optical components in multiple different beam paths, where one or more of those optical components provide variable deflection of an incident beam. In other words, redirecting a beam path through the same optical components can yield multiple beams for purposes of processing. One such illustrative component is an acousto-optic deflector (AOD), which, like an AOM, can vary the direction of its output beam based on a control signal. The multi-beam calibration techniques described herein can be utilized to calibrate such beams.

The turnable mirrors 836 and 840 in the first beam path are motorizied two-axis turn mirrors preferably used to perform discrete, static adjustments, such as to compensate for thermal drift or mechanical creep. The adjustable tilt plate 838 is a motorized two-axis tilt plate that can also be used to perform a discrete, static adjustment to the first beam path. The adjustable tilt plate 854 can be used to adjust, for example, the slope of the second beam path incident on the wafer 240. The turnable mirror 860 is preferably a motorized two-axis turn mirror such as an FSM or piezoelectric XY tip-tilt mirror. The turnable mirror 860 can be used to impart a desired offset to the second laser beam spot with respect to the first. The final turn mirror 225 is preferably a motorized two-axis turn mirror, such as an FSM or piezoelectric XY tip-tilt mirror, like the turnable mirror 860 but perhaps with a smaller range of adjustability. The final turn mirror 225 can be used to jointly steer both laser beam spots on the wafer 240.

Figure 6B:
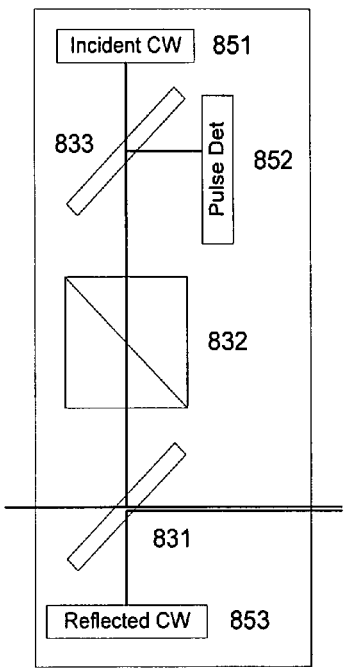
FIG. 6B is a block diagram of a component of the system of FIG. 6A.

One illustrative form of the optical power detectors 830 and 850 is illustrated in greater detail in FIG. 6B. Each of the optical power detectors 830 and 850 includes a beam splitter 831, which passes the incident laser beam propagating from the laser 220 to the wafer 240 while diverting a fraction (e.g., 30%) of that incident beam to a polarizing beam cube splitter 832, which is configured to pass the incident beam to a beam splitter 833. From the beam splitter 833, the diverted portion of the incident beam is directed to an incident continuous-wave detector 851 and to a pulse detector 852. A reflection signal traveling back from the wafer 240 reaches the optical power detector 830 or 850 (from the right, as illustrated), where the beam splitter 831 directs it into a reflection continuous-wave detector 853. The detectors 851, 852, and 853 may be photo detectors, for example. Other designs for the optical power detectors 830 and 850 are possible.

By measuring the magnitude of energy in the incident laser beam during calibration scanning operations, by use of the continuous-wave detector 851, it is possible to normalize the measured magnitude of the reflected signal by computing a ratio of the reflected energy over the incident energy. This reflected over incident ("ROI") ratio more accurately represents changes in the reflectivity on the wafer 240 where the beam spot traverses. Although ROI normalization is optional, it is preferred for enhanced accuracy.

Because of the different polarizations of the two laser beams and the quarter-wave plate 864, the reflected signal from the first laser beam travels to the optical power detector 850 in the other laser beam path, and vice versa. Because of this effect, it may be necessary to refer to the reflected and incident detector in opposite optical power detectors 830 and 850 when computing ROI values. Note also that owing to the polarization of the laser beams the power detectors 830 and 850 shown in FIG. 6B may be oriented into and out of the page in FIG. 6A.

Although polarization differences can significantly separate the reflection signals detected by the two optical power detectors 830 and 850, real-world imperfections can cause imperfections in the orthogonality of the polarization, thereby causing some cross-talk between reflected signals. In those cases in which this parasitic cross-talk is unacceptable, time-based, space-based, and/or code-based techniques can be utilized with the two-detector system 800 to further ameliorate the cross-talk interference.

A controller (not shown), similar to the controller 680 in the system 700B (FIG. 5B), may control the operation of the system 800, including BTW scans, PGC, and other alignment operations.

FIGS. 7A and 7B illustrate BTW measurement scans in greater detail, using the calibration/alignment targets 246. In FIG. 7A, an alignment laser beam spot 610 traverses back and forth across the calibration/alignment target 246 in an X alignment path 620. The beam spot 610 traverses this path 620 back and forth at a number of different focusing heights, and the focusing height producing the sharpest edge transitions is used to register the edge positions of the calibration/alignment target 246. In FIG. 7B, the same process is repeated in the Y direction along a Y alignment path 630. The alignment laser beam spot 610 may or may not be the same as the processing laser beam spot 110. For example, the calibration/alignment laser beam may have reduced power compared to the processing laser beam, so as not to damage the calibration/ alignment target 246 or surrounding material. As another example, the alignment laser beam may be a continuous-wave laser beam rather than a pulsed laser beam.

Alternatively or additionally to the dedicated calibration/alignment targets 246, it is possible to utilize the links, such as the unprocessed links 140, within the dies 242 for alignment or calibration, as disclosed in U.S. patent application Ser. Nos. 11/213,329 and 11/365,468, both of which are incorporated by reference herein.

Performing system position calibration with multiple laser spots is similar to present single-spot calibration. However, the Z-height relationship between each focused beam waist and each target links should be ascertained, as well as the XY position relationship between the focused spots and the target links. Both of these relationships can be determined by scanning alignment targets on the wafer. This scanning process involves delivering either continuous wave or pulsed optical energy to the surface of the wafer and laterally scanning the XY stage such that the light reflects off alignment targets with known coordinates on the wafer. Monitoring the amount of energy reflected from the targets and the stage position sensors allows the position of the laser spots relative to the alignment targets to be determined with precision. These monitored signals also allow determination of the spot sized with the present Z height separation between the lens and the alignment structure.

To focus in a multiple-spot or multiple-beam system, such as the systems 700A, 700B, and 800, a target may be scanned at several focus heights and measurements of contrast or the spot size at these focus heights are used to predict and iteratively refine the focused beam waist. Because a multiple-spot system involving a single lens has only one lens-to-link structure or alignment target separation at a time, it may be necessary to pre-align all of the focused spots of a multi-spot system so that they all have substantially the same focus height. One method for doing so involves directing multiple laser beams onto targets at one or more focus depths, taking focus depth measurements for the various beams, determining relative focus depth differences based on those focus depth measurements, and adjusting the laser beams' paths in response, preferably to reduce the relative focus depth differences. That process can be repeated iteratively or by means of a feedback control system to achieve relative focusing pre-alignment. Thereafter, focus in a live wafer processing environment can be accomplished using just one of the focused laser spots. Focusing may be accomplished with a single target in a focus field, or with multiple targets, such as three or four targets, in a focus field. Focus height distances at the XY locations positions within the focus fields are then computed from the focus heights at the different focus target locations.

Focus in a multiple-spot system may also be enhanced by use of a focus control optic, such as the focus adjuster 834, to offset one or more focused spot beam waists from other focused beam waists in the Z direction.

In addition to being a useful independent focus mechanism, a focus control optic, such as the focus adjuster 834, can impart a known Z focus offset of a focused beam waist relative to other spots to enhance the focus methodology. By scanning an alignment target with these two or more Z-offset spots, the Z direction that must be traveled to achieve focus is known. Three or more Z-offset spots can be used to predict not just the focus direction, but also the distance to focus.

One alignment procedure for a multiple-spot system involves determining the position of all the spots relative to alignment targets and also any Z height dependency of this relationship. In the simplest implementation, an XY alignment target is first scanned and measured by all of the spots in the system to determine the XY and potentially Z offsets of these spots relative to one another. Then, the relative offsets may also be measured at different focus heights. This procedure may be performed on a single target, or many focus targets at different locations on the wafer, or on a calibration grid. The information gathered about the relative positioning of the spots at workpiece processing locations can be processed by one or more computers controlling the machine to calibrate and correct for differences in spot locations when processing different areas of the wafer.

Having characterized the multiple spots relative to one another, wafer XY alignment in different alignment fields can be implemented in a manner analogous to the single-spot system alignment. A target or targets can be scanned to determine the geometric relationship between a focused spot and the target link structures, and a known mapping between the spot locations can be applied to precisely determine the position of the rest of the system's focused spots. Then the XY beam steering mechanisms and focus offset mechanisms can be sent positioning commands to precisely position all of the focused laser spots at the desired locations for link runs and link run segments. This is preferably carried out by creating three-dimensional reference surfaces which define laser-to-workpiece calibrations in a region of the workpiece. Target link coordinates and the trajectory commands of stages, beam steering mechanisms, and focus offset mechanisms can be generated from CAD data of link blow locations, the reference surfaces, and any additional calibration information.

Some XY and focus calibration can be performed with only one of multiple spots on at a time. However there are other procedures where it is advantageous to scan targets with multiple spots that are simultaneously delivered. For example, scanning an XY alignment target using all of the spots at the same time can verify that all spots are focused and that the relative offsets between spots have been removed with the XY beam steering mechanisms through the calibration procedure. Reflection signals off of the scanned target would then appear to have the reflection signature of a single spot of tight focus. If any of the beams are not properly aligned or are out of focus, then multiple possibly overlapping reflection signatures will be observed, or the reflection signature of large spots superimposed with small spots may be observed.

Another calibration procedure using multiple spots simultaneously delivered to the wafer uses an averaging technique to improve the quality of scan measurements. This technique is illustrated in FIG. 8, which illustrates how BTW scans can be performed using a dual-beam system, such as the system 800, and its two laser beams spots, which are denoted "A" and "B." FIG. 8 is a plan view of the alignment target 246 showing the two laser beam spots A and B, used to measure X positions and/or relative offset. If the offset relationship between two spots is known and can be precisely set, then two (or more) spots can be set up to have a small lateral offset (e.g., a couple microns) along the axis that an alignment target 246 will be scanned (the X direction as shown in FIG. 8). Then a single scan of the alignment target, collecting reflected sensor data and stage position data, can be used to determine the locations of the two spots. This information can be combined with the commanded spot offsets to determine the target location with enhanced accuracy by averaging the two spot locations. This technique can be used to refine the accuracy of the spots relative to one another in the scan direction. As an example, assume that the offset distance in the scan direction is 5 µm. Assume further that scanning of spot 1 over the alignment target 810 produces a maximum reflection intensity when the X position is 10,005.020 µm, and that scanning of spot 2 over the alignment target 810 produces a maximum reflection intensity when the X position is 10,000.000 μm. Then, after taking into account the known offset and then averaging the two position measurements, the resulting position would be 10,000.010 μm. Because that average is based on more data than a single measurement, it is a more reliable result.

In a system that can determine which reflections were caused by which incident focused spot, it is possible to practice this averaging procedure with fully overlapping spots. Time slicing and exploiting different spot properties such as polarization or wavelength are some techniques by which a reflected spot can be associated with an incident spot. These techniques may be useful when the spots are partially overlapping or fully overlapping such that the relative offset is zero.

In the second case depicted in FIG. 8 the two scanned spots A and B have both on-axis and cross-axis offset. That provides two estimates of the location of the alignment target 246 with measurements made at different points along the alignment target 246. These multiple measurements are useful for determining absolute positioning on the wafer even when the alignment target 246 is not uniform or imperfect.

Next, since the beams of a multiple spot system may be equipped with real-time XY beam steering mechanisms, such as the turnable mirror 860 or the final turn mirror 225, these mechanisms, rather than the XY stage, may be used to scan the focused spots across alignment targets 246. Then the calibration routine correlates reflected signal energy off of alignment targets 246 with the sensed XY beam steering mechanism position and combines this with the XY stage position to determine spot positioning. Since independent XY beam steering mechanisms can be put in each of the beam paths, it is possible to independently scan XY alignment targets 246 with different focused spots. One target can be scanned in X while another alignment target 246 is scanned in Y with an appropriate method for determining which is the X signal and which is the Y signal. This can be done by dithering the power in the spots at specific frequencies using an AOM or other attenuator to change the energy, and then using the frequency information to determine which reflected signal comes from each spot. Alternatively, scanning the alignment targets 246 with spots moving at different velocities can be used to associate components of a reflection signal with a specific spot. Spots can be also be time-sliced or modulated at a high rate such that only one spot is on at time. Then reflection signals can be directly separated using time slices to allow scanning multiple targets, or an X and a Y target simultaneously. Time slicing can allow the system to align to targets with two reflected signal detectors (one for each beam) or with just one reflected signal detector that captures reflected energy from either spot. Separation based upon an optical property such as polarization or wavelength may also be appropriate for some implementations.

Figure 9:
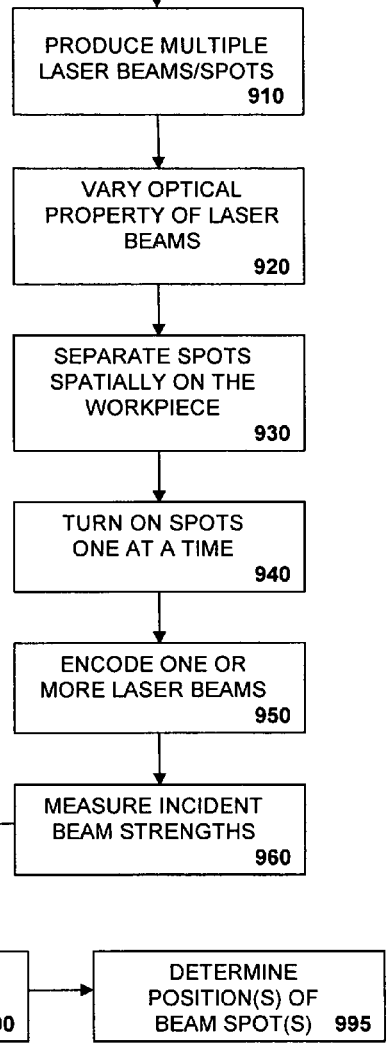
FIG. 9 is a flowchart of a method according to one embodiment.

FIG. 9 is a flowchart of a multi-beam position calibration method 900. The method 900 begins by producing (step 910) multiple laser beams. The step 910 may be performed utilizing multiple lasers or one or more beam splitters with fewer lasers than laser beams.

The next several steps of the method 900 are optional. The method 900 may optionally vary (step 920) one or more optical properties of some or all of the laser beams so that the beams' reflections can be distinguished from each other partially or completely. For example, polarization may be varied among the plurality of laser beams such that each laser beam has a different, preferably orthogonal, polarity. This technique is utilized in the system 800 (FIG. 6A). Other optical properties may be varied. For example, wavelength may be varied, and wavelength selective filters can be utilized to discern one reflection from the others. The variation of optical properties may be achieved at the laser(s) or downstream in the laser beam paths, such as with polarizers, frequency shifters, or the like.

The method 900 may also optionally separate (step 930) the spots spatially on the workpiece such that they do not overlap (preferably completely non-overlapping). The spatial offset may be in the direction of scanning, perpendicular to the direction of scanning, or both. Unless other separation techniques are also employed, it may be necessary to know some information about the spots' spatial distribution or ordering a priori. If the spatial offset between the spots is known with sufficient precision in advance, then averaging techniques can be employed to enhance the accuracy or reliability of positional calibration. Dynamic beam steering elements or static beam alignment adjustment elements, for example, may be utilized to spatially separate the spots on the workpiece.

The method 900 may also optionally turn on (step 940) only one beam/spot at a time (i.e., time-division multiplexing). The length of the time slots allotted to each beam/spot may be large (e.g., on the order of the time required to perform a BTW scan of a target structure) or small (e.g., much smaller than the time required to perform a BTW scan of a target structure). In the former case, one spot may be turned on to do an entire BTW scan of a target while the others are off, and this operation may be repeated with the other spots as necessary. In the latter case, different spots seemingly simultaneously scan the same or different target structures, although each spot is blinking or pulsing rapidly. Optical switches, such as AOMs, can be utilized to turn on and off each spot in a desired pattern.

The method 900 may also optionally encode (step 950) one or more of the laser beams with a modulation or other signal or encoding such that the multiple spot reflection signals can be jointly decoded, preferably with no intolerable level of inter-spot interference. This is a form of code-division multiplexing. As previously described, orthogonal codes are well-suited for this technique because decoding of the reflections signals can be done synchronously with the encoding operation.

The method 900 may also optionally detect or measure (step 960) the incident beam strength. This may be a measurement of amplitude, energy, power, or the like. The step 960 can be beneficial in that it enables reflected signal strength to be normalized so as to better represent actual reflectivity at the workpiece surface rather than variations in incident signal strength.

The method 900 also detects or measures (step 970) reflected beam strength(s). This measurement is preferably a measurement of the same quantity as in step 960, if performed. As the step 970 is performed, commanded or sensed motion stage position data is recorded. The step 970 may be performed using multiple reflection detectors (e.g., one for each beam/spot) or a single shared reflection detector or some number in between. Each reflection detector may be placed at an appropriate location in a beam path(s) to pick up reflection(s) from the workpiece. In the case where steps 930, 940, or 950 and 980 are performed, then only one reflection detector may be necessary. If the step 920 is performed, then in most cases multiple reflection detectors will be needed, although there may be cases in which a single reflection detector can distinguish among multiple reflections based on their different optical properties.

If the method 900 performs the encoding step 950, then it also performs a decoding step 980 to decode the reflection signal(s) to remove the encoding and thereby recover the underlying reflection signal while diminishing (preferably to zero) cross-talk interference from the other beams' reflections.

If the method 900 performs the step 960 to measure incident beam strength, then it may also compute (step 990) an ROI ratio to normalize the results of step 970 with the corresponding results of step 960.

Finally, the method 900 determines (step 995) positions of one or more of the laser beam spots within the coordinate space of the workpiece based on the reflections signal(s). This completes positional calibration or enables further processing to complete positional calibration.

The methods and systems illustrated and described herein can exist in a variety of forms both active and inactive. For example, they can exist as one or more software, firmware, or other programs comprised of program instructions in source code, object code, executable code or other formats. Any of the above formats can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

The terms and descriptions used above are set forth by way of illustration only and are not meant as limitations. Those skilled in the art will recognize that many variations can be made to the details of the above-described embodiments without departing from the underlying principles of the invention. For example, the principles, methods, machines and systems disclosed herein have general applicability for processing any structure on or within a semiconductor substrate using laser radiation for any purpose. While the examples and embodiments that follow are described in the context in which those structures are laser-severable links on or within an IC (e.g., memory device, logic device, optical or optoelectronic device including LEDs, and microwave or RF devices), other structures besides laser-severable links can be processed in the same or similar manner, and the teachings set forth herein are equally applicable to the laser processing of other types of structures, such as electrical structures that become conductive as a result of laser radiation, other electrical structures, optical or electro-optical structures, and mechanical or electro-mechanical structures (e.g., MEMS (micro electro-mechanical structures) or MOEMS (micro opto-electro-mechanical structures)). As another example, not all link processing is for the purpose of severing a link so it does not conduct; sometimes the purpose of the laser radiation is to sever, cleave, make, heat, alter, diffuse, anneal, drill, trim, route, or measure a structure or its material. For example, laser radiation can induce a state change in a structure's material, cause the migration of dopants, or alter magnetic properties—any of which could be used to connect, disconnect, tune, modify, or repair electrical circuitry or other structures. The scope of the invention should therefore be determined only by the following claims—and their equivalents—in which all terms are to be understood in their broadest reasonable sense unless otherwise indicated.

The invention claimed is:

1. A system for determining relative position of a semiconductor substrate and at least one laser beam spot on or within the semiconductor substrate in a machine used to selectively irradiate structures on or within the semiconductor substrate using a plurality of laser beams, the system comprising:
    a means for producing at least a first laser beam and a second laser beam, wherein the first laser beam propagates toward the semiconductor substrate along a first laser beam propagation path having a first laser beam axis that intersects the semiconductor substrate at a first spot, and wherein the second laser beam propagates toward the semiconductor substrate along a second laser beam propagation path having a second laser beam axis that intersects the semiconductor substrate at a second spot;
    a means for detecting reflection of both the first and second spots from one or more reflective structures on or within the semiconductor substrate while the first and second laser beam spots move relative to the semiconductor substrate, thereby generating at least one reflection signal; and
    a means for determining, based on said at least one reflection signal, positions of both the first and second spots on or within the semiconductor substrate.

2. A system according to claim 1, in which the first laser beam and the second laser beam differ from one another in at least one optical property.

3. A system according to claim 2, wherein said at least one optical property comprises polarization, and wherein the first sensor detects a reflection having a first polarization and the second sensor detects a reflection having a second polarization different from the first polarization.

4. A system according to claim 1, wherein both the first laser beam and the second laser beam are not energized at the same time when utilizing the means for detecting reflection.

5. A system according to claim 4, wherein the first laser beam spot is scanned completely over one of said one or more reflective structures while the second laser beam is off, and the laser beam spot is scanned completely over one of said one or more second reflective structures while the first laser beam is off.

6. A system according to claim 4, wherein the first laser beam spot is scanned over a portion of one of said one or more reflective structures while the second laser beam is off, and the laser beam spot is scanned over a portion of one of said one or more second reflective structures while the first laser beam is off.

7. A system according to claim 4, further comprising:
    a first optical switch disposed in the first laser beam propagation path, wherein the first optical switch can selectively block or pass the first laser beam from reaching the semiconductor substrate; and
    a second optical switch disposed in the second laser beam propagation path, wherein the second optical switch can selectively block or pass the second laser beam from reaching the semiconductor substrate.

8. A system according to claim 1, wherein, at any given time when utilizing the means for detecting reflection, the first spot and the second spot are at different positions on or within the semiconductor substrate.

9. A system according to claim 8, wherein the first and second beam spots are offset from each other by some non-zero amount in a direction in which the beam spots move with respect to a given reflective structure.

10. A system according to claim 8, wherein the first and second beam spots are offset from each other by some non-zero amount in a direction perpendicular to which the beam spots move with respect to a given reflective structure.

11. A system according to claim 1, further comprising:
a first incidence light energy sensor positioned to detect a magnitude of the first laser beam as it propagates toward the semiconductor substrate; and
a second incidence light energy sensor positioned to detect a magnitude of the second laser beam as it propagates toward the semiconductor substrate.

12. A system according to claim 11, wherein the means for detecting reflection computes a ratio of a magnitude of reflection of the first spot to a magnitude of the first laser beam as it propagates toward the semiconductor substrate, and a ratio of a magnitude of reflection of the second spot to a magnitude of the second laser beam as it propagates toward the semiconductor substrate, and wherein the means for detecting reflection determines positions of the first and second spots on or within the semiconductor substrate using the respective ratios.

13. A system according to claim 1, wherein the means for detecting reflection is positioned to measure a signal reflected from the semiconductor substrate along the second laser beam propagation path, and the means for detecting reflection is positioned to measure a signal reflected from the semiconductor substrate along the first laser beam propagation path.

14. A system for determining relative positions between a semiconductor substrate and at least one of a plurality of laser beam spots on or within the semiconductor substrate in a machine for selectively irradiating structures on or within the semiconductor substrate using a plurality of laser beams, the system comprising:
a laser source producing at least a first laser beam and a second laser beam;
a first laser beam propagation path, along which the first laser beam propagates toward the semiconductor substrate, the first laser beam propagation path having a first laser beam axis that intersects the semiconductor substrate at a first spot;
a second laser beam propagation path, along which the second laser beam propagates toward the semiconductor substrate, the second laser beam propagation path having a second laser beam axis that intersects the semiconductor substrate at a second spot;
a reflection sensor capable of detecting reflection of each of the first and second spots individually and both of the first and second spots substantially simultaneously from one or more reflective structures on or within the semiconductor substrate as the one or both of the first and second laser beam spots move relative to the semiconductor substrate, thereby generating at least one reflection signal; and
a processor configured to determine, based on said at least one reflection signal, positions of both the first and second spots on or within the semiconductor substrate.

15. A system according to claim 14, wherein both the first laser beam and the second laser beam are not energized at the same time when utilizing the sensor to determine the positions of the first and second beam spots on the semiconductor substrate.

16. A system according to claim 15, further comprising:
a first optical switch disposed in the first laser beam path, wherein the first optical switch can selectively block or pass the first laser beam from reaching the semiconductor substrate; and
a second optical switch disposed in the second laser beam path, wherein the second optical switch can selectively block or pass the second laser beam from reaching the semiconductor substrate.

17. A system according to claim 15, wherein the first laser beam spot is scanned over a portion of one of said one or more first reflective structures while the second laser beam is off, and the second laser beam spot is scanned over a portion of one of said one or more second reflective structures while the first laser beam is off.

18. A system according to claim 15, wherein the first laser beam spot is scanned completely over one of said one or more first reflective structures while the second laser beam is off, and the second laser beam spot is scanned completely over one of said one or more second reflective structures while the first laser beam is off.

19. A system according to claim 14, wherein, at any given time when utilizing the sensor to detect a magnitude of reflection of one or more of the first and second beam spots, the first spot and the second spot are directed at different positions on or within the semiconductor substrate.

20. A system according to claim 19, wherein the first and second beam spots are offset from each other by some non-zero amount in a direction in which the beam spots move with respect to a given reflective structure.

21. A system according to claim 19, wherein the first and second beam spots are offset from each other by some non-zero amount in a direction perpendicular to which the beam spots move with respect to a given reflective structure.

22. A system according to claim 14, further comprising:
an incidence light energy sensor positioned to detect a magnitude of each of the first and second laser beams as they propagate toward the semiconductor substrate, wherein the processor:
computes a ratio of a magnitude of reflection of the first spot to an incident magnitude of the first laser, thereby generating a first magnitude ratio;
computes a ratio of a magnitude of reflection of the second spot to an incident magnitude of the second laser beam, thereby generating a second magnitude ratio; and
determines positions of both the first and second spots on or within the semiconductor substrate using the first and second magnitude ratios.

23. A system according to claim 14, wherein the first and second laser beams are capable of both selectively irradiating structures on or within the semiconductor substrate and determining alignment with the semiconductor substrate, depending on the energy of the first and second laser beams.

24. A system according to claim 14, wherein the laser source comprises:
a first laser producing the first laser beam; and
a second laser producing the second laser beam.

25. A system according to claim 14, wherein the laser source comprises:
a single laser; and
a beam splitter disposed in both the first and second laser beam propagation paths, the beam splitter producing the first and second laser beams from a laser beam generated by the single laser.

26. A method for determining relative position of a semiconductor substrate and at least one laser beam spot on or within the semiconductor substrate in a machine used to selectively irradiate structures on or within the semiconductor substrate using a plurality of laser beams, the method comprising:

producing at least a first laser beam and a second laser beam, wherein the first laser beam propagates toward the semiconductor substrate along a first laser beam propagation path having a first laser beam axis that intersects the semiconductor substrate at a first spot, and wherein the second laser beam propagates toward the semiconductor substrate along a second laser beam propagation path having a second laser beam axis that intersects the semiconductor substrate at a second spot;

detecting reflection of both the first and second spots from one or more reflective structures on or within the semiconductor substrate while the first and second laser beam spots move relative to the semiconductor substrate, thereby generating at least one reflection signal; and determining, based on one or more of said at least one reflection signal, positions of both the first and second spots on or within the semiconductor substrate.

27. A method according to claim 26, wherein, at any given time when performing the detecting step, the first spot and the second spot are directed at different positions on or within the semiconductor substrate.

28. A method according to claim 27, wherein the first and second beam spots are offset from each other by some non-zero amount in a direction in which the beam spots move with respect to a given reflective structure.

29. A method according to claim 27, wherein the first and second beam spots are offset from each other by some non-zero amount in a direction perpendicular to which the beam spots move with respect to a given reflective structure.

30. A method according to claim 26, further comprising:
detecting a magnitude of the first laser beam as it propagates toward the semiconductor substrate;
detecting a magnitude of the second laser beam as it propagates toward the semiconductor substrate;
computing a ratio of a magnitude of reflection of the first spot to an incident magnitude of the first laser beam, thereby generating a first magnitude ratio; and
computing a ratio of a magnitude of reflection of the second spot to an incident magnitude of the second laser beam, thereby generating a second magnitude ratio;
wherein the determining step determines positions of the first and second spots on or within the semiconductor substrate using the first and second magnitude ratios.

31. A method according to claim 26, further comprising:
detecting a magnitude of reflection of the first spot from one or more reflective structures on or within the semiconductor substrate as the first laser beam spot moves relative to the semiconductor substrate, thereby generating a first reflection signal; and
detecting a magnitude of reflection of the second spot from one or more reflective structures on or within the semiconductor substrate as the second laser beam spot moves relative to the semiconductor substrate, thereby generating a second reflection signal.

32. A method according to claim 31, wherein the first laser beam and the second laser beam differ in at least one optical property.

33. A method according to claim 32, wherein said at least one optical property comprises polarization.

34. A method according to claim 33, further comprising:
detecting a magnitude of the first laser beam as it propagates toward the semiconductor substrate;
detecting a magnitude of the second laser beam as it propagates toward the semiconductor substrate;
computing a ratio of a magnitude of reflection of the first spot to an incident magnitude of the first laser beam, thereby generating a first magnitude ratio; and
computing a ratio of a magnitude of reflection of the second spot to an incident magnitude of the second laser beam, thereby generating a second magnitude ratio;
wherein the reflection of the first spot propagates along the second laser beam path, and the reflection of the second spot propagates along the first laser beam path;
and wherein the determining step determines positions of the first and second spots on or within the semiconductor substrate using the first and second magnitude ratios.

35. A method according to claim 26, wherein the first laser beam and the second laser beam are not energized at the same time when detecting reflection of the first and second spots from the one or more reflective structures on or within the semiconductor substrate.

36. A method according to claim 35, wherein the detecting step comprises
scanning the first laser spot completely over one of said one or more reflective structures while the second laser beam is off; and
scanning the second laser beam spot completely over one of said one or more reflective structures while the first laser beam is off.

37. A method according to claim 35, wherein the detecting step comprises:
scanning the first laser beam spot over a portion of one of said one or more reflective structures while the second laser beam is off; and
scanning the second laser beam spot over a portion of one of said one or more reflective structures while the first laser beam is off.

38. A method according to claim 26, wherein the first and second laser beams are capable of both selectively irradiating structures on or within the semiconductor substrate and determining alignment with the semiconductor substrate, depending on the energy of the first and second laser beams.

39. A method according to claim 26, wherein producing at least a first laser beam and a second laser beam comprises:
producing a first laser beam from a first laser; and
producing a second laser beam from a second laser.

* * * * *